United States Patent
Ha et al.

(10) Patent No.: US 10,373,887 B2
(45) Date of Patent: Aug. 6, 2019

(54) FAN-OUT SEMICONDUCTOR PACKAGE

(71) Applicant: SAMSUNG ELECTRONICS CO., LTD., Suwon-si (KR)

(72) Inventors: Seung Soo Ha, Suwon-si (KR); Hyeon Seok Lee, Suwon-si (KR); Sun Ho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/895,604

(22) Filed: Feb. 13, 2018

(65) Prior Publication Data
US 2019/0088566 A1    Mar. 21, 2019

(30) Foreign Application Priority Data
Sep. 15, 2017  (KR) .................. 10-2017-0118705

(51) Int. Cl.
| H01L 23/31 | (2006.01) |
| H01L 21/48 | (2006.01) |
| H01L 23/00 | (2006.01) |
| H01L 23/498 | (2006.01) |
| H01L 21/56 | (2006.01) |

(52) U.S. Cl.
CPC ........ *H01L 23/3128* (2013.01); *H01L 21/486* (2013.01); *H01L 21/4853* (2013.01); *H01L 21/563* (2013.01); *H01L 23/3114* (2013.01); *H01L 23/49816* (2013.01); *H01L 24/06* (2013.01); *H01L 2224/02379* (2013.01)

(58) Field of Classification Search
CPC . H01L 21/4853; H01L 21/486; H01L 21/563; H01L 23/3114; H01L 23/49816; H01L 23/3128; H01L 24/06
See application file for complete search history.

(56) References Cited

U.S. PATENT DOCUMENTS 6,627,976 B1    9/2003  Chung et al.
7,042,071 B2 *  5/2006  Minamio .............. H01L 21/565
                                            257/666
(Continued)

FOREIGN PATENT DOCUMENTS

| TW | 201712768 A1 | 4/2017 |
| TW | 201727849 A1 | 8/2017 |
| TW | 201729291 A | 8/2017 |

OTHER PUBLICATIONS

Office Action issued in Taiwanese Application No. 107104931 dated Oct. 16, 2018, with English translation.

*Primary Examiner* — Andrew Q Tran
(74) *Attorney, Agent, or Firm* — Sughrue Mion, PLLC

(57) ABSTRACT

A fan-out semiconductor package includes a core member having a through-hole. A semiconductor chip is in the through-hole and has an active surface with connection pads and an inactive surface opposing the active surface. An encapsulant encapsulates at least portions of the core member and the semiconductor chip and fills at least a portion of the through-hole. A connection member is on the core member and the active surface of the semiconductor chip and includes a redistribution layer electrically connected to the connection pads. The core member includes a groove portion penetrating from a wall of the through-hole up to an outer side surface of the core member in a lower portion of the core member on which the connection member is disposed.

22 Claims, 10 Drawing Sheets

(56) References Cited

U.S. PATENT DOCUMENTS

| | | |
|---|---|---|
| 7,614,888 B2 | 11/2009 | Tong et al. |
| 8,138,014 B2 * | 3/2012 | Chi .................... H01L 25/0657 |
| | | 257/E21.499 |
| 2013/0001274 A1 | 1/2013 | Konno et al. |
| 2017/0133309 A1 | 5/2017 | Kim et al. |
| 2017/0141043 A1 | 5/2017 | Park |

* cited by examiner

FAN-OUT SEMICONDUCTOR PACKAGE

CROSS-REFERENCE TO RELATED APPLICATION(S)

This application claims benefit of priority to Korean Patent Application No. 10-2017-0118705 filed on Sep. 15, 2017 in the Korean Intellectual Property Office, the disclosure of which is incorporated herein by reference in its entirety.

BACKGROUND

1. Field

The present disclosure relates to a semiconductor package, and more particularly, to a fan-out semiconductor package in which electrical connection structures extend outwardly of a region in which a semiconductor chip is disposed.

2. Description of Related Art

A significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of semiconductor package technology suggested to satisfy the technical demand as described above is a fan-out semiconductor package. Fan-out packages have a compact size and redistribute connection terminals outwardly from the region in which a semiconductor chip is disposed.

SUMMARY

An aspect of the present disclosure may provide a fan-out semiconductor package including a core member which is disposed in a region in which a semiconductor chip is encapsulated and may support the fan-out semiconductor package. The core member may include wirings, if necessary, and may substantially prevent a problem of voids in the encapsulant despite the inclusion of the core member.

According to an aspect of the present disclosure, the core member may include a groove portion to serve as an air path in a lower portion of the core member.

According to an aspect of the present disclosure, a fan-out semiconductor package may include a core member having a through-hole. A semiconductor chip is in the through-hole and has an active surface with connection pads and an inactive surface opposing the active surface. An encapsulant encapsulates at least portions of the core member and the semiconductor chip and fills at least a portion of the through-hole. A connection member is on the core member and the active surface of the semiconductor chip and includes a redistribution layer electrically connected to the connection pads. The core member includes a groove portion penetrating from a wall of the through-hole up to an outer side surface of the core member in a lower portion of the core member on which the connection member is disposed.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to a direction opposite to the direction toward the mounting surface of the fan-out semiconductor package. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
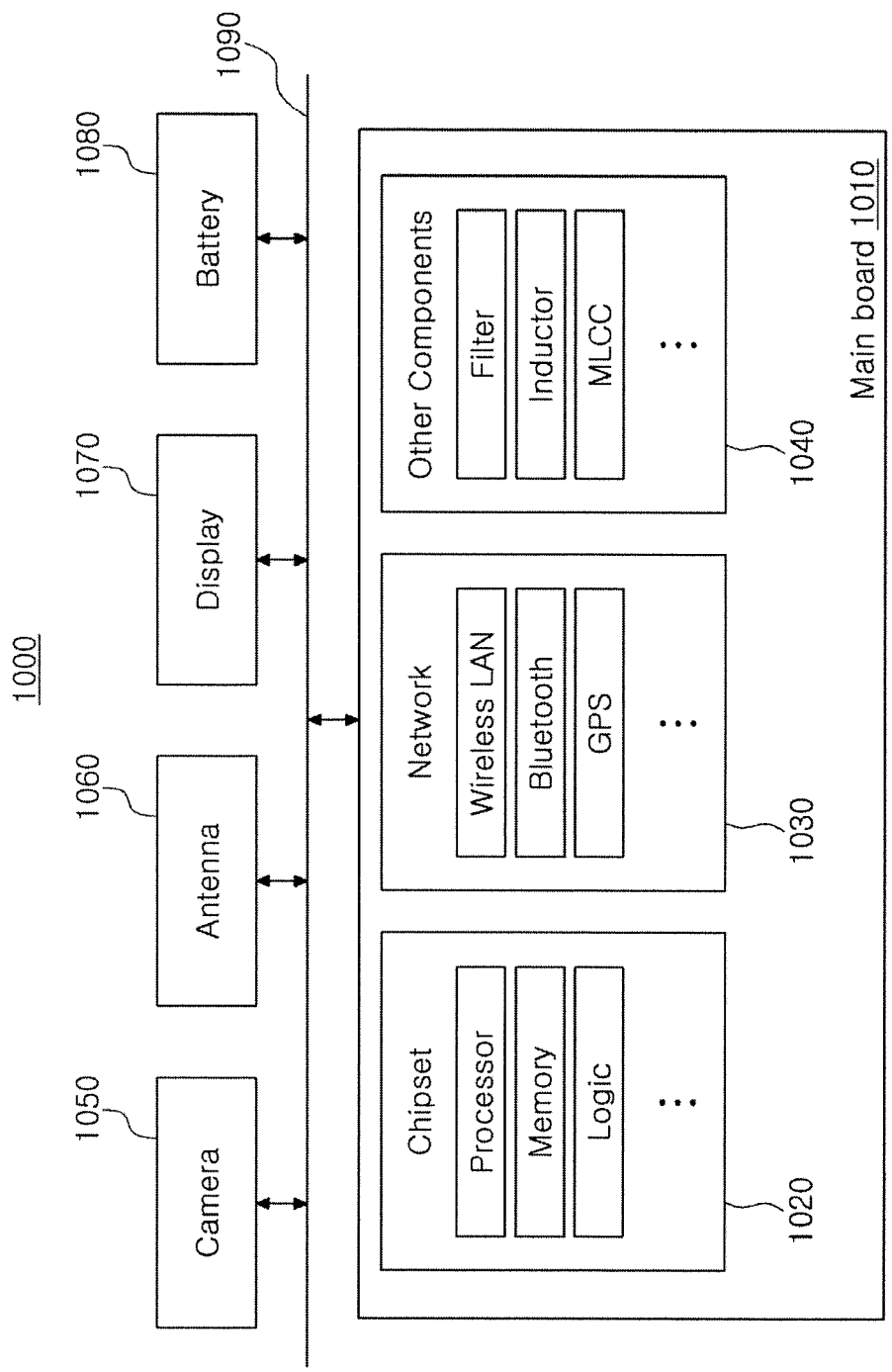
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like. The chip related components 1020 may also include an application processor chip such as a central processor (for example, a central processing unit (CPU)), a graphics processor (for example, a graphics processing unit (GPU)), a digital signal processor, a cryptographic processor, a microprocessor, a microcontroller, or the like. The chip related components 1020 may further include a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components designed to operate pursuant to protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include components designed to operate pursuant to a variety of other wireless or wired standards or protocols. In addition, the network related components 1030 may be combined with each other, and may also be combined together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto and may also include passive components used for various other purposes, or the like. In addition, other components 1040 may be combined with each other, may be combined together with the chip related components 1020 and/or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, or a battery 1080. Other components that may be included (but are not illustrated) include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, the other components are not limited thereto and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device.

Figure 2:
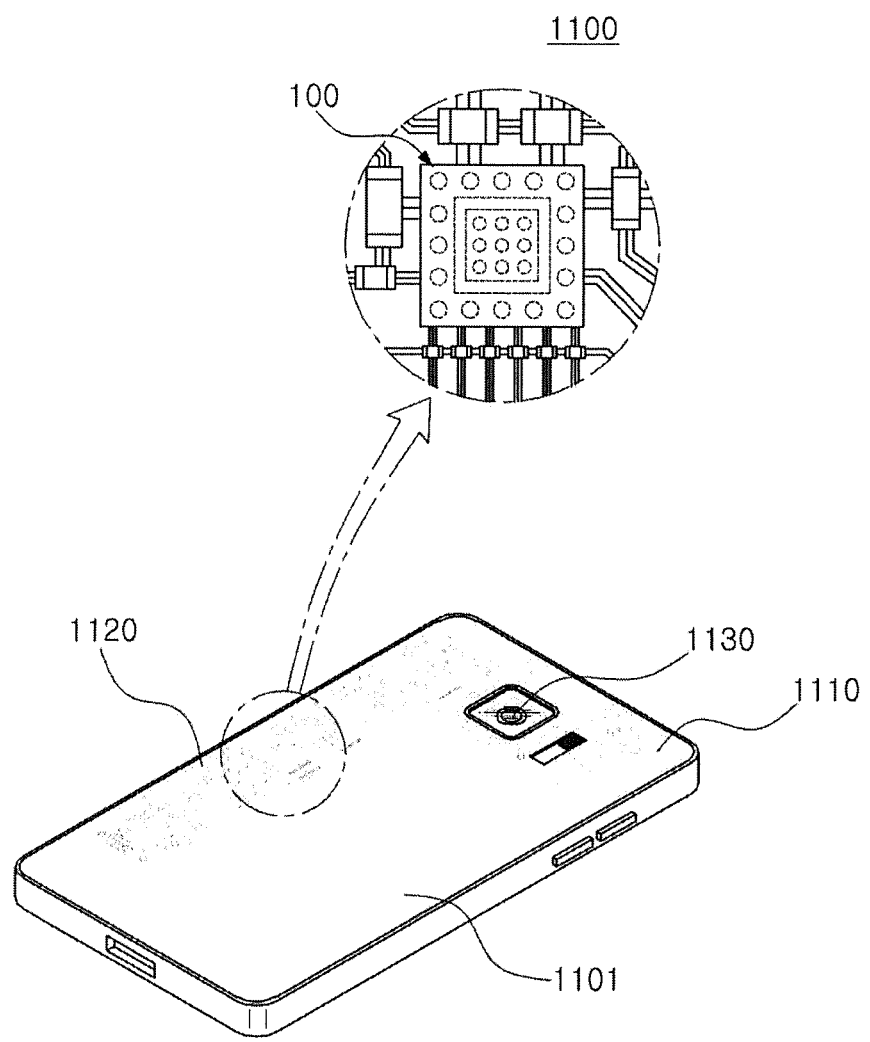
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. The semiconductor chip may not serve as a finished product in itself, and also may be damaged due to external physical or chemical impacts. The semiconductor chip may be packaged and used in an electronic device, or the like, in a packaged state.

One reason that semiconductor packaging is required are differences in the width between the semiconductor chip and the main board of the electronic device in terms of electrical connections. In detail, the size of connection pads of the semiconductor chip and the intervals between those connection pads are very fine, whereas the size of component mounting pads of the main board used in the electronic device and the interval between those pads are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3:
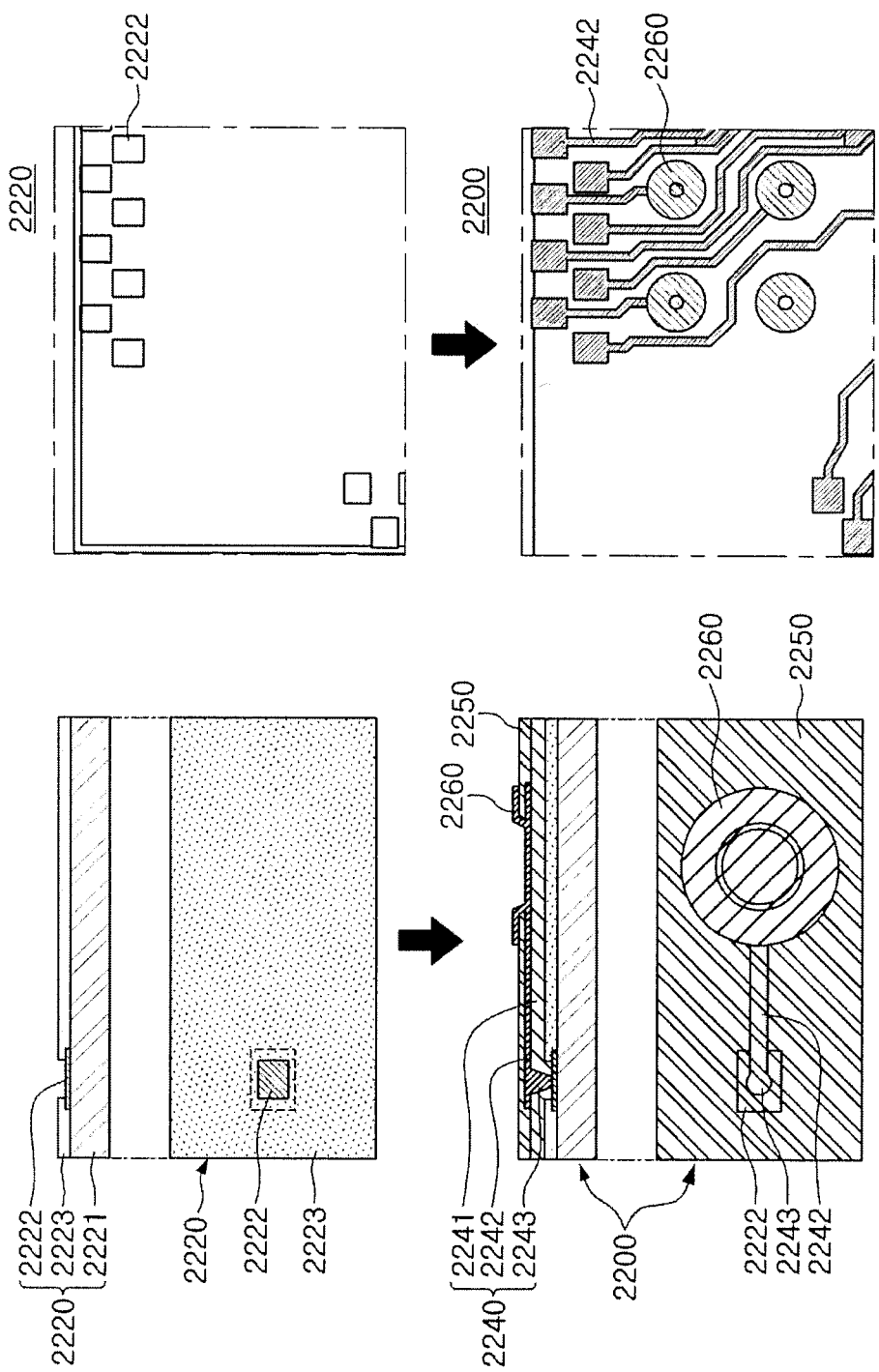
FIGS. 3A and 3B are schematic cross-sectional views illustrating states of a fan-in semiconductor package before and after being packaged.

FIGS. 3A and 3B are schematic cross-sectional views illustrating states of a fan-in semiconductor package before and after being packaged.

Figure 4:
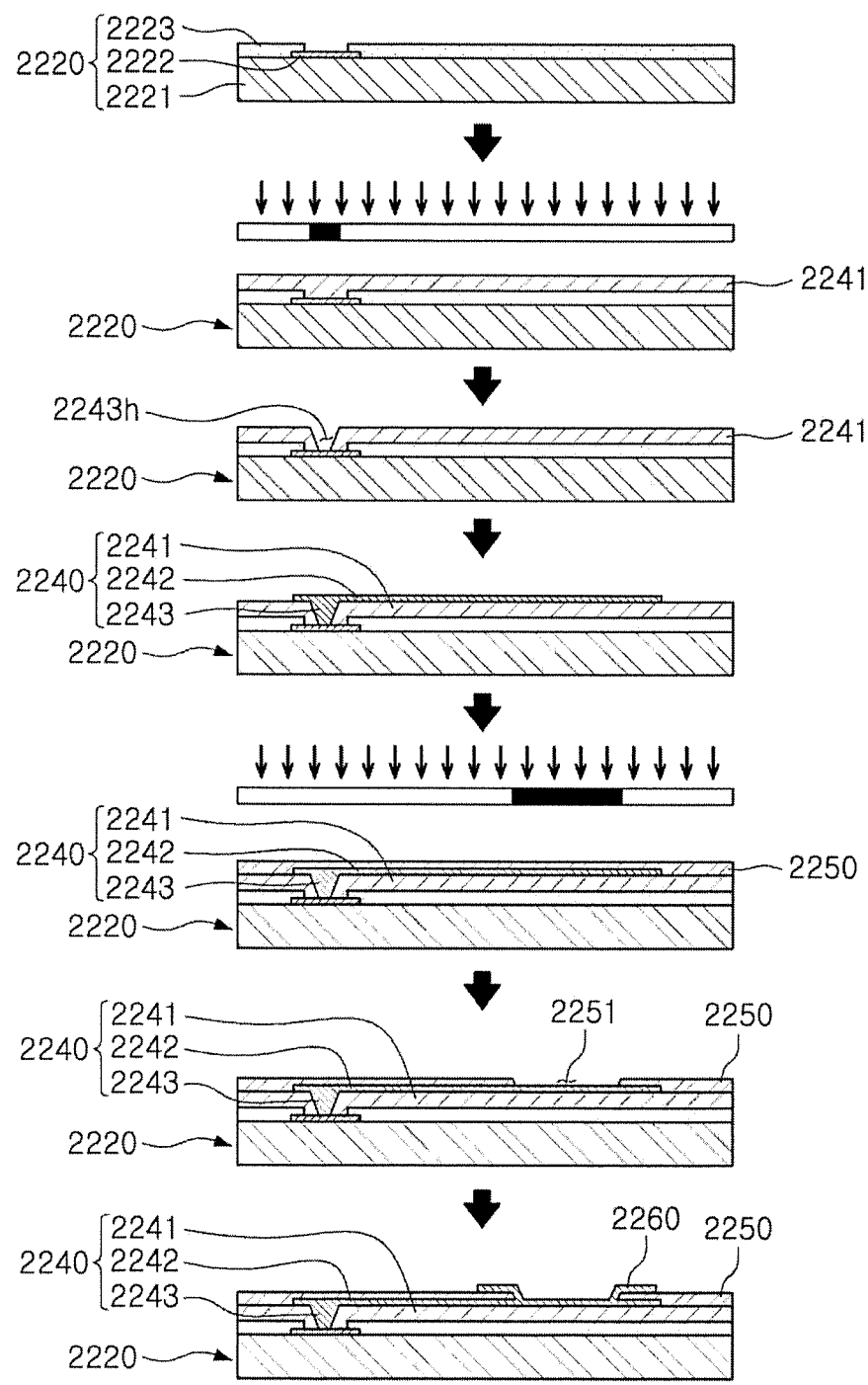
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, and may include a body 2221 made of silicon (Si), germanium (Ge) gallium arsenide (GaAs), or the like. There may be connection pads 2222 formed on one surface of the body 2221 that include a conductive material such as aluminum (Al), or the like, and there may be a passivation layer 2223 such as an oxide film, a nitride film, or the like, formed on one surface of the body 2221 and covering at least portions of the connection pads 2222. Since the connection pads 2222 are relatively small, it is difficult to mount the integrated circuit (IC) on an intermediate level printed circuit board (PCB) or on the main board of the electronic device, or the like.

A connection member 2240 may thus be formed depending on the size of the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h providing openings to the connection pads 2222, and then forming wiring patterns 2242 and vias 2243. A passivation layer 2250 protecting the connection member 2240 may be formed. An opening 2251 in the passivation layer 2250 may be formed, and an underbump metal layer 2260, or the like, may be formed in the opening 2251. The fan-in semiconductor package 2200 including, for example, the semiconductor chip 2220, the connection member 2240, the passivation layer 2250, and the underbump metal layer 2260 may thus be manufactured.

As described above, the fan-in semiconductor package may have a package form in which all of the connection pads of the semiconductor chip, input/output (I/O) terminals for example, are disposed inside the semiconductor chip. The package may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has large spatial limitations. It is difficult to apply this structure to a semiconductor chip having a large number of I/O terminals or a semiconductor chip having a compact size. In addition, due to the disadvantages described above, it may not be possible for the fan-in semiconductor package to be directly mounted and used on the main board of the electronic device. Even when the size of the I/O terminals of the semiconductor chip and the intervals between those I/O terminals are increased by a redistribution process, the size and intervals of the I/O terminals may not be sufficient to allow the fan-in semiconductor package to be directly mounted on the main board of the electronic device.

Figure 5:
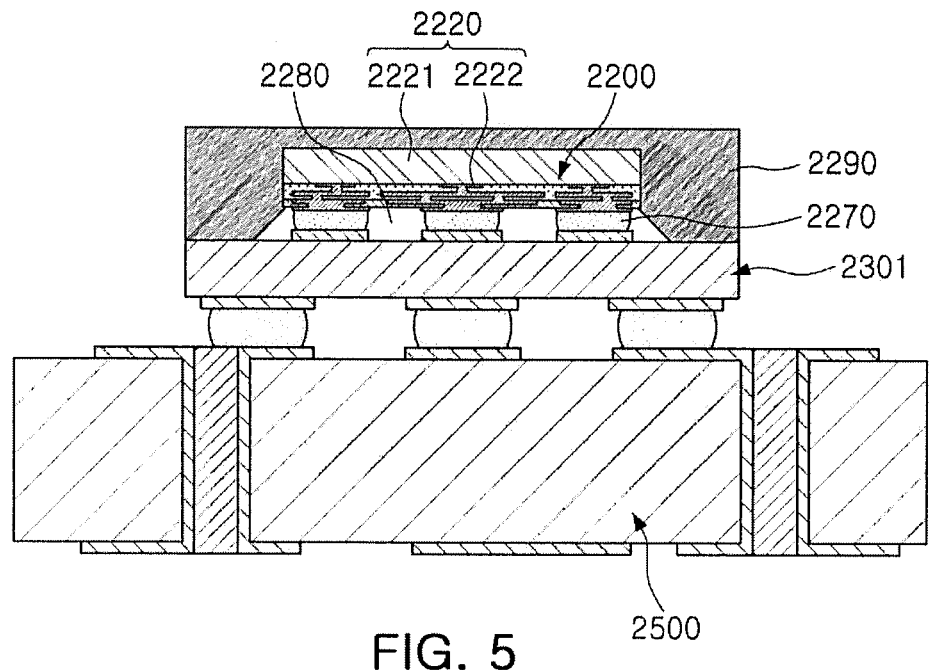
FIG. 5 is a schematic cross-sectional view illustrating a fan-in semiconductor package mounted on an interposer substrate and ultimately mounted on a main board of an electronic device.

FIG. 5 is a schematic cross-sectional view illustrating a fan-in semiconductor package mounted on an interposer substrate and ultimately mounted on a main board of an electronic device.

Figure 6:
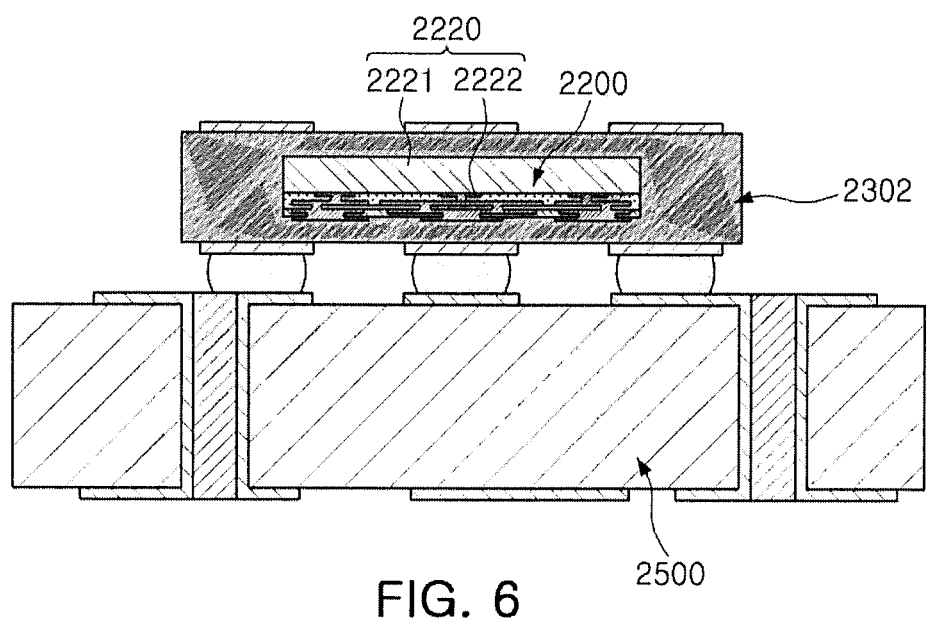
FIG. 6 is a schematic cross-sectional view illustrating a fan-in semiconductor package embedded in an interposer substrate and ultimately mounted on a main board of an electronic device.

FIG. 6 is a schematic cross-sectional view illustrating a fan-in semiconductor package embedded in an interposer substrate and ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301. The fan-in semiconductor package 2200 may be ultimately mounted on a main board 2500 of an electronic device where it is mounted on the interposer substrate 2301. Solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302. Connection pads 2222, that is, I/O terminals, of the semiconductor chip 2220 may be redistributed by the interposer substrate 2302 where the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
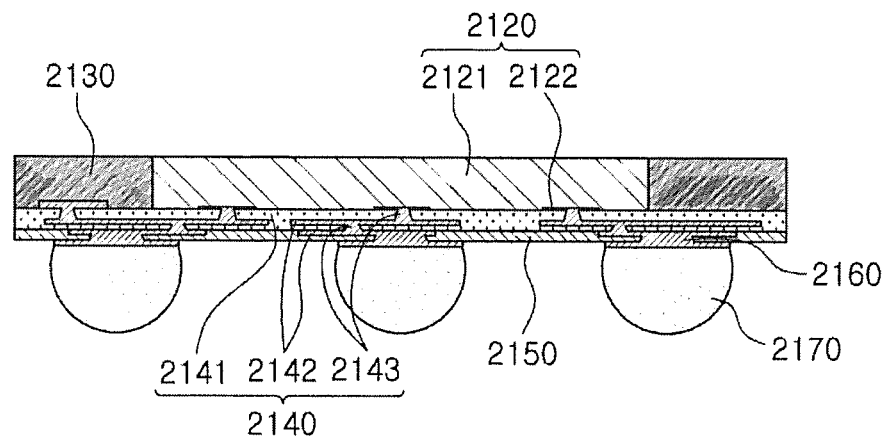
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. A passivation layer 2150 may be further formed on the connection member 2140, and an underbump metal layer 2160 may be formed in openings of the passivation layer 2150. Solder balls 2170 may be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

The fan-out semiconductor package has a form where I/O terminals of the semiconductor chip may be redistributed and disposed outwardly of the semiconductor chip through the connection member formed on the semiconductor chip. In the fan-in semiconductor package, all I/O terminals of the semiconductor chip need to be disposed inward of the semiconductor chip. Therefore, in the fan-in semiconductor package, when the size of the semiconductor chip is decreased, the size and pitch of the solder balls need to be decreased, such that it may not be possible to use a standardized solder ball layout. On the other hand, the fan-out semiconductor package has a form where the I/O terminals of the semiconductor chip are redistributed and disposed outwardly of the semiconductor chip through the connection member formed on the semiconductor chip as described above. Therefore, even when the size of the semiconductor chip is decreased, a standardized ball layout may still be used in the fan-out semiconductor package as it is, such that the fan-out semiconductor package may be mounted on the main board of the electronic device without using a separate interposer substrate.

Figure 8:
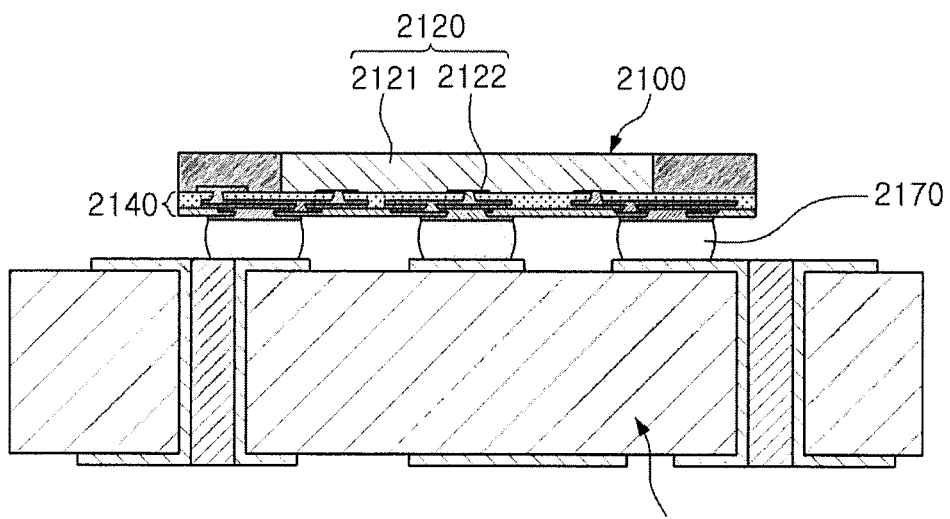
FIG. 8 is a schematic cross-sectional view illustrating a fan-out semiconductor package mounted on a main board of an electronic device.

FIG. 8 is a schematic cross-sectional view illustrating a fan-out semiconductor package mounted on a main board of an electronic device.

Referring to the drawing, a fan-out semiconductor package 2100 may be mounted on a main board 2500 of an electronic device through solder balls 2170, or the like. The fan-out semiconductor package 2100 includes the connection member 2140 formed on the semiconductor chip 2120 and capable of redistributing the connection pads 2122 to a fan-out region that is outside of the vertical area of the semiconductor chip 2120. A standardized ball layout may thus be used in the fan-out semiconductor package 2100 as it is. As a result, the fan-out semiconductor package 2100 may be mounted on the main board 2500 of the electronic device without using a separate interposer substrate, or the like.

Since the fan-out semiconductor package may be mounted on the main board of the electronic device without using the separate interposer substrate, the fan-out semiconductor package may be implemented with a smaller thickness than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a different concept from that of a printed circuit board (PCB) such as an interposer substrate, or the like, having a scale, a purpose, and the like, different from those of the fan-out semiconductor package, and having the fan-in semiconductor package embedded therein.

Hereinafter, a fan-out semiconductor package including a core member disposed in a region in which a semiconductor chip is encapsulated and supporting the fan-out semiconductor package will be described with reference to the drawings. The core member may include wirings, if desired. The fan-out semiconductor package described below may substantially prevent a problem of voids in its encapsulant.

Figure 9:
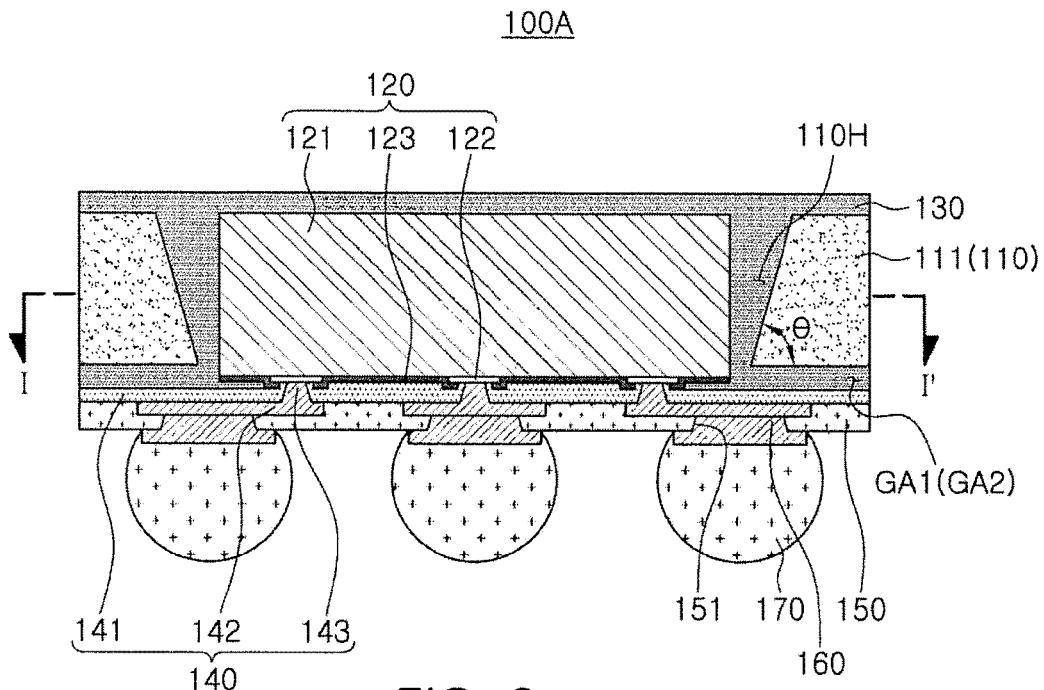
FIG. 9 is a schematic cross-sectional view illustrating an exemplary fan-out semiconductor package.

FIG. 9 is a schematic cross-sectional view illustrating an exemplary fan-out semiconductor package.

Figure 10:
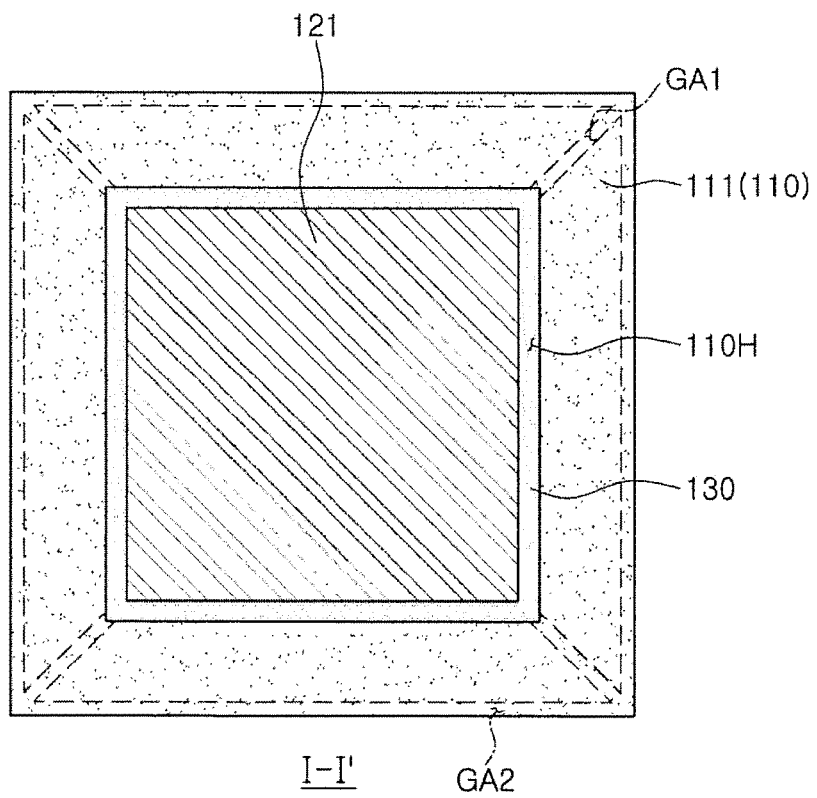
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a core member 110 having a through-hole 110H. A semiconductor chip 120 may be disposed in the through-hole 110H of the core member 110 and may have an active surface with connection pads 122 disposed thereon and an inactive surface opposing the active surface. An encapsulant 130 may encapsulate at least portions of the core member 110 and the semiconductor chip 120 and may fill at least a portion of the through-hole 110H. A connection member 140 may be disposed on the core member 110 and the active surface of the semiconductor chip 120 and may include redistribution layers 142 electrically connected to the connection pads 122. A passivation layer 150 may be disposed on the connection member 140, with an underbump metal layer 160 disposed in openings 151 of the passivation layer 150, and electrical connection structures 170 disposed on the passivation layer 150 and connected to the underbump metal layer 160.

A semiconductor package may generally be manufactured by simply encapsulating a semiconductor chip with an encapsulant and forming redistribution layers on an active surface of the encapsulated semiconductor chip. However, it is difficult to control warpage of such a semiconductor package, and there is a limitation in various wiring designs. In order to solve such a problem, a core member may be provided with a through-hole in the region where the semiconductor chip is encapsulated. The warpage of the semiconductor package may thus be controlled by the core member, and various types of wiring designs may become possible by designing wirings in the core member. However, when the core member is introduced, voids may be generated at locations such as: between walls of the through-hole and the encapsulant, between side surfaces of the semiconductor chips and the encapsulant, and/or between the encapsulant and an insulating layer of the redistribution layer. Problems such as delamination, or the like, may occur due to these voids.

In the fan-out semiconductor package 100A according to the exemplary embodiment, one or more groove portions GA1 may be formed in a lower portion of the core member 110. The groove portions GA1 may penetrate into the core member 110 from walls of the through-hole 110H out to outer side surfaces of the core member 110. Groove portions GA1 with such a form may serve as air paths to thus prevent voids from being generated when the semiconductor chip and the core member are encapsulated with the encapsulant 130. That is, when the semiconductor chip 120 and the core member 110 are encapsulated with the encapsulant 130, the encapsulant 130 may fill through the groove portions GA1 up toward or to the sawing or cutting lines at the outer portions of the core member 110 to prevent voids from being generated. In order to address the risk of only partial filling by the encapsulant, any non-filled regions may be compensated for by using a pressure oven after the encapsulant 130 is added. When the manner of filling the encapsulant by the pressure as described above is used, a substantially void-free structure may be approximately achieved.

The respective components included in the fan-out semiconductor package 100A according to the exemplary embodiment will hereinafter be described in more detail.

The core member 110 may improve rigidity of the fan-out semiconductor package 100A depending on its materials, and may serve to secure uniformity in the thickness of the encapsulant 130. When wiring layers, vias, and the like, are formed in the core member 110, the fan-out semiconductor package 100A may be utilized as a package-on-package (POP) type package. The core member 110 may have a through-hole 110H, with the semiconductor chip 120 disposed in the through-hole 110H and spaced apart from the core member 110 by a predetermined distance with the side surfaces of the semiconductor chip 120 surrounded by the core member 110. However, such a form is only an example and may be variously modified to have other forms, and the core member 110 may perform another function depending on such forms.

The core member 110 may include an insulating layer 111. An insulating material may be used as a material of the insulating layer 111. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. A material having high rigidity, such as the prepreg including the glass fiber, or the like, may be used as the material of the insulating layer 111, and the core member 110 may be used as a support member for controlling warpage of the fan-out semiconductor package 100A.

One or more groove portions GA1 may be formed in a lower portion of the core member 110. For example, the groove portions GA1 may be formed in four corner regions of the lower portion of the core member 110. The respective groove portions GA1 may penetrate from the walls of the through-hole 110H out to the outer side surfaces of the core member 110. The groove portions GA1 with such a form may serve as the air paths to thus prevent or minimize voids from being generated when the semiconductor chip and the core member are encapsulated with the encapsulant 130, as described above. A groove portion GA2 penetrating through the lower portion of the core member 110 along edges of the core member 110 may also be formed in one or more outer side portions of the lower portion of the core member 110. The respective groove portions GA1 may be connected to the groove portion GA2 to effectively prevent or minimize voids from being generated when forming the encapsulant 130.

The through-hole 110H of the core member 110 may have a tapered shape, with the walls of the core member 110 inclined at a predetermined angle (θ). The tapered shape may be a shape where a width at an upper opening region of the through-hole 110H is greater than that at a lower opening region of the through-hole 110H. That is, the through-hole may have an approximately reverse trapezoidal shape. When the through-hole 110H of the core member 110 has the tapered shape described above, the encapsulant 130 may be more easily formed to further reduce the generation of the voids.

The groove portions GA1 and GA2 are illustrated in the cross-sectional view of FIG. 9 as completely penetrating through the lower portion of the core member 110 for convenience of explanation, but the groove portions GA1 may be formed in specific regions of the lower portion of the core member 110, as illustrated in the plan view of FIG. 10, and a plurality of groove portions GA1 may be variously formed depending on the design.

The semiconductor chip 120 may be an integrated circuit (IC) provided in an amount of several hundreds to several millions of elements or more integrated in a single chip. The IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. The IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. The abovementioned elements may also be combined with each other.

The semiconductor chip 120 may be formed on the basis of an active wafer. The semiconductor chip 120 may include a body 121 with a base material that may be silicon (Si), germanium (Ge), gallium arsenide (GaAs), or the like. Various circuits may be formed on the body 121. The connection pads 122 may electrically connect the semiconductor chip 120 to other components. The material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123, such that the encapsulant 130 may fill at least a portion of a space between the passivation layer 123 and the connection member 140. The step may prevent the encapsulant 130 from bleeding into the lower surface of the connection pad 123. An insulating layer (not illustrated), and the like, may be further disposed in other required positions. The semiconductor chip 120 may be a bare die. A redistribution layer (not illustrated) may be formed on the active surface of the semiconductor chip 120 and bumps (not illustrated), or the like, may be connected to the connection pads 122.

The encapsulant 130 may protect the core member 110, the semiconductor chip 120, and the like. The form of the encapsulant 130 is not particularly limited, but may be a form where the encapsulant 130 surrounds at least portions of the core member 110, the semiconductor chip 120, and the like. For example, the encapsulant 130 may cover the core member 110 and the inactive surface of the semiconductor chip 120, and may fill spaces between the walls of the through-hole 110H and the side surfaces of the semiconductor chip 120. The encapsulant 130 may also fill at least a portion of the space between the passivation layer 123 of the semiconductor chip 120 and the connection member 140. The encapsulant 130 may fill the through-hole 110H to thus serve as an adhesive and reduce buckling of the semiconductor chip 120. The encapsulant 130 may fill at least portions of the groove portions GA1 and GA2. That is, an encapsulating process may be carried out to prevent or minimize void defects whereby the encapsulant 130 is discharged into the groove portions GA1 and GA2.

The material of the encapsulant 130 is not particularly limited. For example, an insulating material may be used as the material of the encapsulant 130. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a photoimagable encapsulant (PIE) resin may also be used as the insulating material.

The connection member 140 may redistribute the connection pads 122 of the semiconductor chip 120. Several tens to several hundreds of connection pads 122 of the semiconductor chip 120 with various functions may be redistributed by the connection member 140, and may be physically or electrically connected to an external source through the electrical connection structures 170 depending on their functions. The connection member 140 may include insulating layers 141 disposed on the core member 110 and the active surface of the semiconductor chip 120, the redistribution layers 142 disposed on the insulating layer 141, and vias 143 penetrating through the insulating layers 141 and connecting the connection pads 122 and the redistribution layers 142 to each other. The drawings illustrate the connection member 140 as including one insulating layer, one redistribution layer, and one via layer, but the connection member 140 may also include a larger number of insulating layers, redistribution layers, and via layers.

The material of each of the insulating layers 141 may be an insulating material. A photosensitive insulating material such as a PID resin may also be used as the insulating material. That is, each of the insulating layers 141 may be a photosensitive insulating layer. When the insulating layer 141 has photosensitive properties, the insulating layer 141 may be formed to have a smaller thickness, and a fine pitch of the via 143 may be achieved more easily. Each of the insulating layers 141 may be a photosensitive insulating layer including an insulating resin and an inorganic filler. When the insulating layers 141 include multiple layers, the materials of the insulating layers 141 may be the same as each other or may be different from each other. When the insulating layers 141 include multiple layers, the insulating layers 141 may be integrated with each other such that boundaries therebetween may not be apparent.

The redistribution layers 142 may substantially serve to redistribute the connection pads 122. The material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on the designs of their corresponding layers. For example, the redistribution layers 142 may include ground (GND) patterns, power (PWR) patterns, signal (S) patterns, and the like. The signal (S) patterns may include various signals except for the ground (GND) patterns, the power (PWR) patterns, and the like, such as data signals, and the like. The redistribution layers 142 may include via pad patterns, electrical connection structure pad patterns, and the like. Each of the redistribution layers 142 may have a thickness of approximately 0.5 μm to 15 μm.

The vias 143 may electrically connect the redistribution layers 142, the connection pads 122, or the like, formed on different layers to each other, resulting in an electrical path in the fan-out semiconductor package 100A. The material of each of the vias 143 may be, for example, a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. The vias 143 may have shapes such as a tapered shape, a cylindrical shape, and the like.

The passivation layer 150 may protect the connection member 140 from external physical or chemical damage. The passivation layer 150 may have openings 151 exposing at least portions of the redistribution layer 142 of the connection member 140. The number of openings 151 formed in the passivation layer 150 may be several tens to several thousands. The material of the passivation layer 150 is not particularly limited and may be an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may be used.

The underbump metal layer 160 may improve connection reliability of the electrical connection structures 170 to improve board level reliability of the fan-out semiconductor package 100A. The underbump metal layer 160 may be connected to the redistribution layer 142 of the connection member 140 exposed through the openings 151 of the passivation layer 150. The underbump metal layer 160 may be formed in the openings 151 of the passivation layer 150 by a metallization method using a conductive metal.

The electrical connection structures 170 may physically or electrically externally connect the fan-out semiconductor package 100A. For example, the fan-out semiconductor package 100A may be mounted on the main board of the electronic device through the electrical connection structures 170. Each of the electrical connection structures 170 may be formed of a conductive material, for example, a solder, or the like. However, the material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and solder. When the electrical connection structures 170 are formed as a single layer structure, the electrical connection structures 170 may include tin-silver solder or copper (Cu). However, the electrical connection structures 170 are not limited thereto.

The number, interval, form, and the like, of the electrical connection structures 170 are not particularly limited, and may be selected depending on design particulars. The electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metal layer 160 extending onto one surface of the passivation layer 150, and connection reliability may be more excellent.

At least one of the electrical connection structures 170 may be disposed in a fan-out region. The fan-out region is the region outward from the region vertically below the semiconductor chip 120. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Although not illustrated in the drawings, a metal thin film may be formed on the walls of the through-hole 110H, if necessary, in order to dissipate heat or block electromagnetic waves. A plurality of semiconductor chips 120 performing functions that are the same as or different from each other may be disposed in the through-hole 110H, and a separate passive component such as an inductor, a capacitor, or the like, may be disposed in the through-hole 110H. A passive component, for example, a surface mounted technology (SMT) component including an inductor, a capacitor, or the like, may be disposed on a surface of the passivation layer 150.

Figure 11:
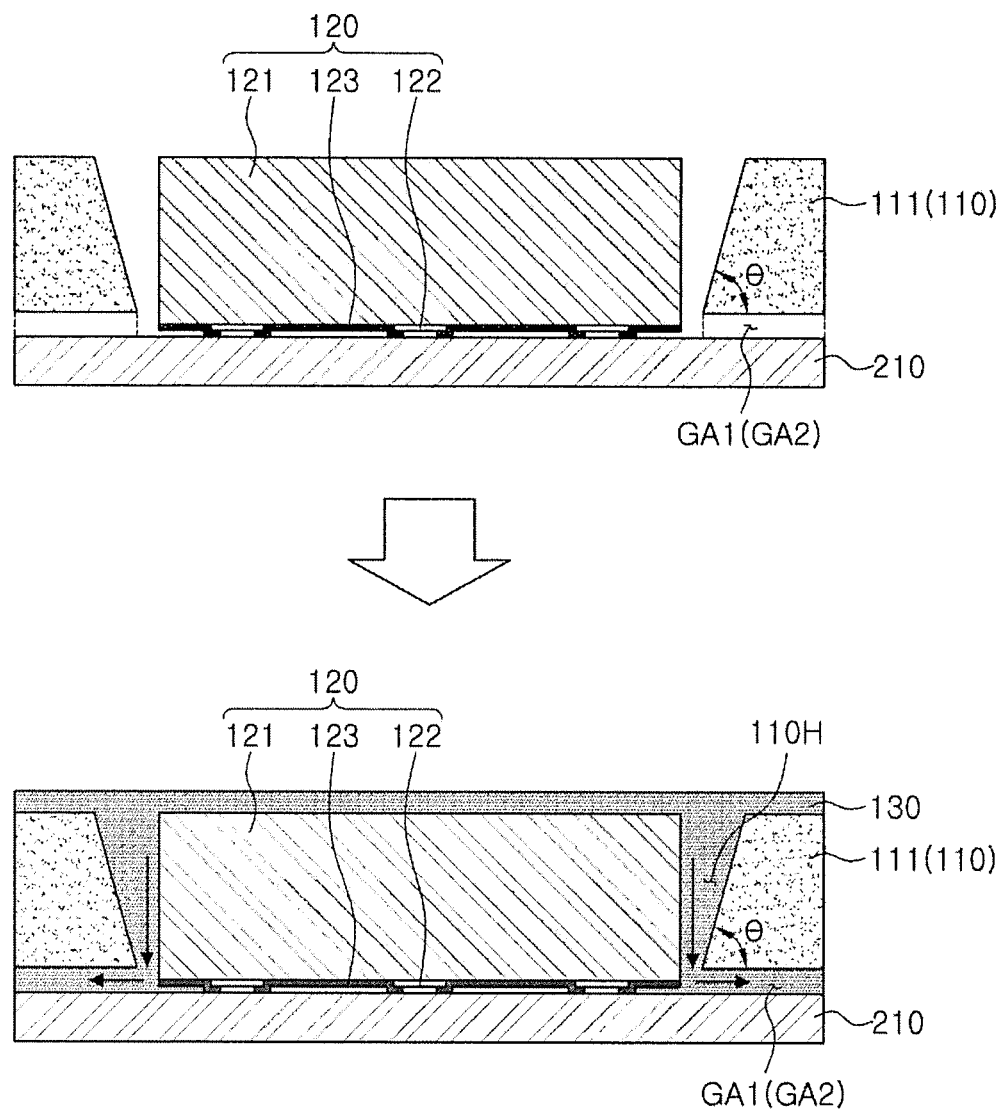
FIG. 11 is schematic views illustrating an encapsulating process of the fan-out semiconductor package of FIG. 9.

FIG. 11 includes schematic views illustrating an encapsulating process of the fan-out semiconductor package of FIG. 9.

Referring to FIG. 11, the core member 110 with through-hole 110H may be first attached to a tape 210. The groove portions GA1 and GA1 may be formed in the core member 110 in advance by a laser process. The semiconductor chip 120 may be attached to a region of the tape 210 exposed through the through-hole 110H. An encapsulation process may be performed by laminating the encapsulant 130 on the tape 210. The pressure may be increased at the time of filling the encapsulant 130 through the groove portions GA1 and GA2, and the groove portions GA1 and GA2 may serve as air vents. Therefore, the generation of the voids when the semiconductor chip 120 and the core member 110 are encapsulated with the encapsulant 130 may be prevented or minimized. When the semiconductor chip 120 and the core member 110 are encapsulated with the encapsulant 130, the encapsulant 130 may be filled up to the sawing lines at the outer portions of the core member 110 through the groove portions GA1 and GA2 to prevent voids from being generated. In order to address only partial filling by the encapsulant, non-filled regions may be compensated for using the pressure oven after the encapsulant 130 is stacked. When the manner of filling the encapsulant by the pressure as described above is used, a substantially void-free structure may be approximately achieved. The encapsulant filled in the sawing lines may be removed at the time of sawing the fan-out semiconductor package. The groove portions GA2 of corner regions where at least portions are filled with the encapsulant 130 and the groove portion GA1 of an inner designed region may remain in the respective fan-out semiconductor packages 100A.

Figure 12:
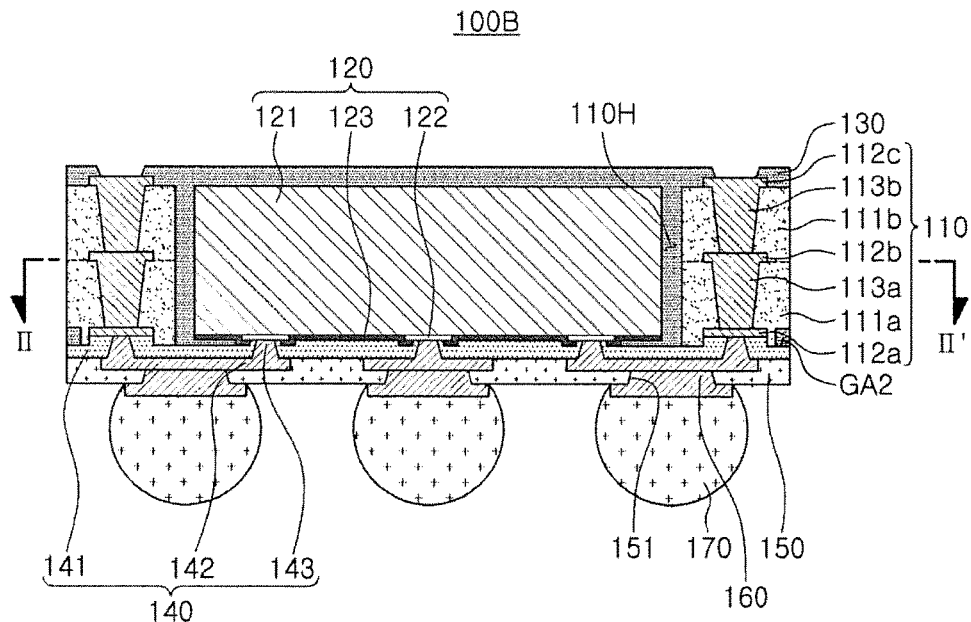
FIG. 12 is a schematic cross-sectional view illustrating another exemplary fan-out semiconductor package.

FIG. 12 is a schematic cross-sectional view illustrating another exemplary fan-out semiconductor package.

Figure 13:
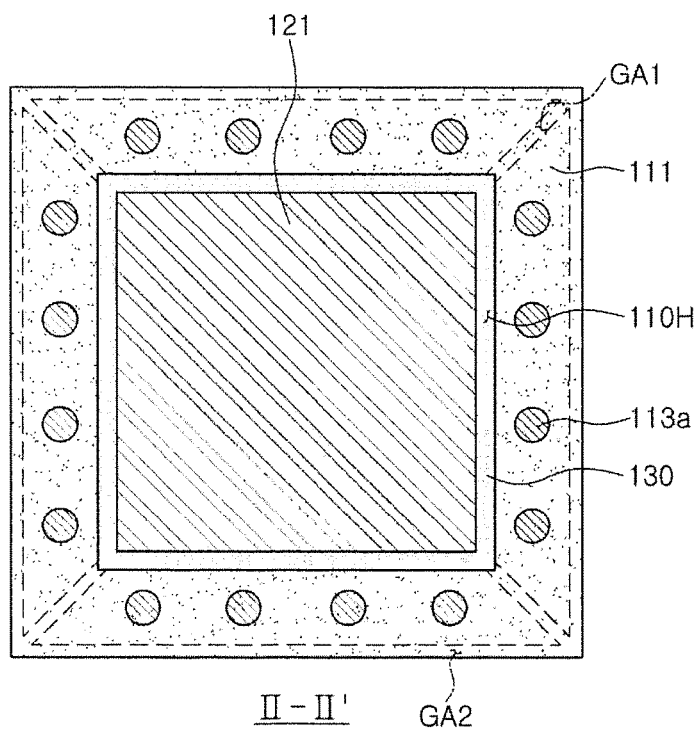
FIG. 13 is a schematic plan view taken along line II-II' of the fan-out semiconductor package of FIG. 12.

FIG. 13 is a schematic plan view taken along line II-II' of the fan-out semiconductor package of FIG. 12.

Referring to the drawings, in a fan-out semiconductor package 100B according to another exemplary embodiment in the present disclosure, a core member 110 may include a first insulating layer 111a in contact with a connection member 140. A first wiring layer 112a in contact with the connection member 140 may be embedded in a surface of the first insulating layer 111a. A second wiring layer 112b may be disposed on the opposing surface of the first insulating layer 111a. A second insulating layer 111b may be disposed on the first insulating layer 111a and may cover the second wiring layer 112b. A third wiring layer 112c may be disposed on the second insulating layer 111b. The first to third wiring layers 112a, 112b, and 112c may be electrically connected to connection pads 122. The first and second wiring layers 112a and 112b and the second and third wiring layers 112b and 112c may be electrically connected to each other through first and second vias 113a and 113b penetrating through the first and second insulating layers 111a and 111b, respectively.

The abovementioned groove portions GA1 and GA2 may be formed in a lower portion of the first insulating layer 111a. Therefore, as described above, the generation of voids when forming the encapsulant 130 may be prevented or minimized in the fan-out semiconductor package 100B. The groove portions GA1 and GA2 are not visible in the cross-sectional view of FIG. 12, in order to more easily describe features of the fan-out semiconductor package 100B according to another exemplary embodiment, but the groove portions GA1 and GA2 are shown by the dashed lines illustrated in FIG. 13. The shapes of cross sections of the groove portions GA1 and GA2 may be similar to those illustrated in FIG. 9, and at least portions of the groove portions GA1 and GA2 may be filled with the encapsulant 130.

Embedding the first wiring layer 112a in the first insulating layer 111a may significantly reduce or eliminate a step generated due to a thickness of the first wiring layer 112a, and the insulating distance of the connection member 140 may thus become constant. That is, there can be minimal or no difference between the distance from the redistribution layer 142 of the connection member 140 to the lower surface of the first insulating layer 111a and the distance from the redistribution layer 142 of the connection member 140 to the connection pad 122 of a semiconductor chip 120. For instance, that difference can be smaller than the thickness of the first wiring layer 112a. Therefore, it can be easier to achieve a high density wiring design of the connection member 140.

A lower surface of the first wiring layer 112a of the core member 110 may be disposed on a level above a lower surface of the connection pad 122 of the semiconductor chip 120. In addition, the distance between the redistribution layer 142 of the connection member 140 and the first wiring layer 112a of the core member 110 may be greater than the distance between the redistribution layer 142 of the connection member 140 and the connection pad 122 of the semiconductor chip 120. This can result from the first wiring layer 112a being recessed into the first insulating layer 111a. Having the first wiring layer 112a recessed into the first insulating layer 111a, such that the lower surface of the first insulating layer 111a and the lower surface of the first wiring layer 112a have a step therebetween, may prevent material of the encapsulant 130 from bleeding in to pollute the first wiring layer 112a. The second wiring layer 112b of the core member 110 may be disposed on a level between an active surface and an inactive surface of the semiconductor chip 120. The core member 110 may be formed at a thickness corresponding to that of the semiconductor chip 120. Therefore, the second wiring layer 112b formed in the core member 110 may be disposed on a level between the active surface and the inactive surface of the semiconductor chip 120.

Thicknesses of the wiring layers 112a, 112b, and 112c of the core member 110 may be greater than those of the redistribution layers 142 of the connection member 140. Since the core member 110 may have a thickness equal to or greater than that of the semiconductor chip 120, the wiring layers 112a, 112b, and 112c may have large sizes depending on a scale of the core member 110. On the other hand, the redistribution layers 142 of the connection member 140 have relatively smaller sizes than those of the wiring layers 112a, 112b, and 112c to achieve thinness.

The material of each of the insulating layers 111a and 111b is not particularly limited and an insulating material may be used. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112a, 112b, and 112c may serve to redistribute the connection pads 122 of the semiconductor chip 120. The material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the wiring layers 112a, 112b, and 112c may include ground (GND) patterns, power (PWR) patterns, signal (S) patterns, and the like. The signal (S) patterns may include various signals except for the ground (GND) patterns, the power (PWR) patterns, and the like, such as data signals, and the like. The wiring layers 112a, 112b, and 112c may include via pads, wire pads, electrical connection structure pads, and the like.

The vias 113a and 113b may electrically connect the wiring layers 112a, 112b, and 112c formed on different layers to each other, resulting in an electrical path in the core member 110. The material of each of the vias 113a and 113b may be a conductive material. Each of the vias 113a and 113b may be completely filled with the conductive material, or the conductive material may also be formed along a wall of each of via holes. Each of the vias 113a and 113b may have all of the shapes known in the related art, such as a tapered shape, a cylindrical shape, and the like. When holes for the first vias 113a are formed, some of the pads of the first wiring layer 112a may serve as stoppers, and it may thus be advantageous that each of the first vias 113a has the tapered shape of which a width of an upper surface is greater than that of a lower surface. The first vias 113a may be integrated with the pad patterns of the second wiring layer 112b. In addition, when holes for the second vias 113b are formed, some of the pads of the second wiring layer 112b may also serve as stoppers, and it may thus similarly be advantageous in that each of the second vias 113b has the tapered shape of which a width of an upper surface is greater than that of a lower surface. The second vias 113b may be integrated with the pad patterns of the third wiring layer 112c.

Hereinafter, a description of aspects overlapping those described above is omitted.

Figure 14:
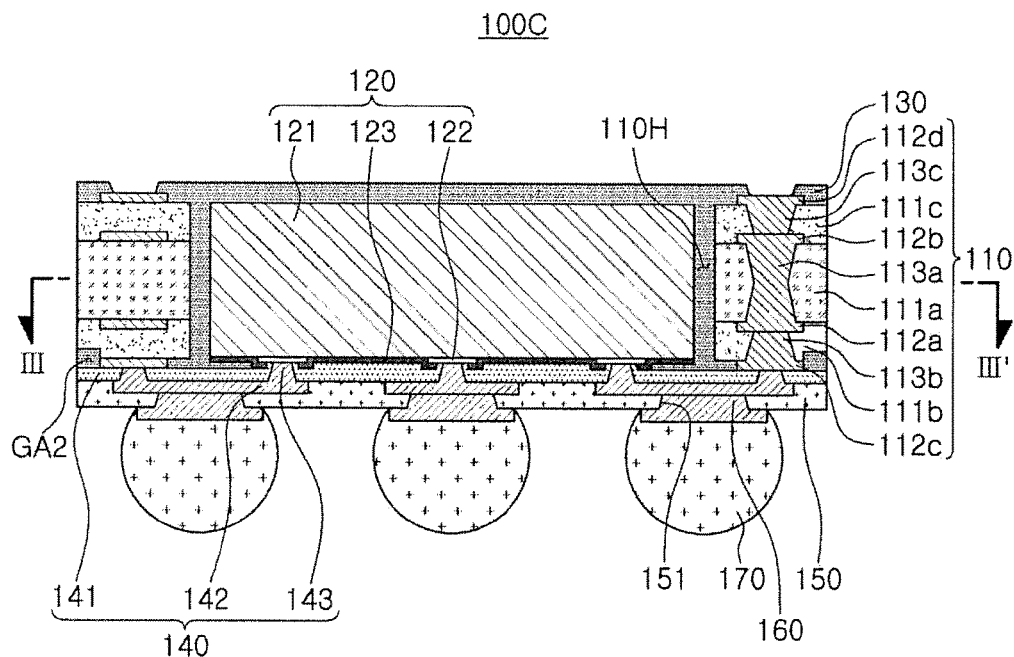
FIG. 14 is a schematic cross-sectional view illustrating another exemplary fan-out semiconductor package.

FIG. 14 is a schematic cross-sectional view illustrating another exemplary fan-out semiconductor package.

Figure 15:
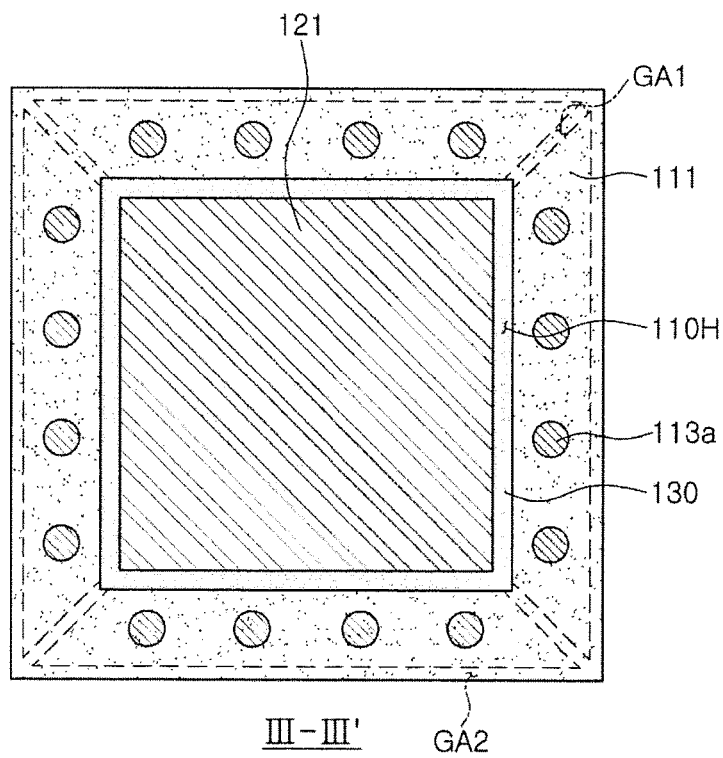
FIG. 15 is a schematic plan view taken along line III-III' of the fan-out semiconductor package of FIG. 14.

FIG. 15 is a schematic plan view taken along line of the fan-out semiconductor package of FIG. 14.

Referring to the drawings, in a fan-out semiconductor package 100C according to another exemplary embodiment in the present disclosure, a core member 110 may include a first insulating layer 111a. A first wiring layer 112a and a second wiring layer 112b may be disposed on opposing surfaces of the first insulating layer 111a, respectively. A second insulating layer 111b may be disposed below the first insulating layer 111a and covering the first wiring layer 112a. A third wiring layer 112c may be disposed below the second insulating layer 111b. A third insulating layer 111c may be disposed above the first insulating layer 111a and may cover the second wiring layer 112b. A fourth wiring layer 112d may be disposed above the third insulating layer 111c. The first to fourth wiring layers 112a, 112b, 112c, and 112d may be electrically connected to connection pads 122. Since the core member 110 may include a large number of wiring layers 112a, 112b, 112c, and 112d, a connection member 140 may be further simplified. This may suppress decreases in yield due to defects occurring during the manufacturing process. The first to fourth wiring layers 112a, 112b, 112c, and 112d may be electrically connected to each other through first to third vias 113a, 113b, and 113c each penetrating through the first to third insulating layers 111a, 111b, and 111c.

The abovementioned groove portions GA1 and GA2 may be formed in a lower portion of the second insulating layer 111b, which is below first insulating layer 111a. Therefore, as described above, generation of voids when forming the encapsulant 130 may be prevented or minimized in the fan-out semiconductor package 100C. The groove portions GA1 and GA2 are at locations not visible in the cross-sectional view of FIG. 14 in order to more easily describe features of the fan-out semiconductor package 100C according to another exemplary embodiment, but the groove portions GA1 and GA2 may be formed as illustrated in FIG. 15. The shapes of the cross sections of the groove portions GA1 and GA2 may be similar to those illustrated in FIG. 9, and at least portions of the groove portions GA1 and GA2 may be filled with the encapsulant 130.

The first insulating layer 111a may have a thickness greater than those of the second or third insulating layers 111b or 111c. The first insulating layer 111a may be relatively thicker in order to maintain rigidity, and the second and third insulating layers 111b and 111c may be added to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. The materials of the first insulating layer 111a may be stronger than the materials of the second and third insulating layers 111b and 111c, such that the insulating layer 111a provides rigidity. The first vias 113a penetrating through the first insulating layer 111a may have a diameter greater than those of second vias 113b and third vias 113c each penetrating through the second insulating layer 111b and the third insulating layer 111c.

The lower surface of the third wiring layer 112c of the core member 110 may be disposed at a level below the lower surface of the connection pad 122 of a semiconductor chip 120. The distance between the redistribution layer 142 of the connection member 140 and the third wiring layer 112c of the core member 110 may be smaller than that between the redistribution layer 142 of the connection member 140 and the connection pad 122 of the semiconductor chip 120. The third wiring layer 112c may be disposed in a protruding form on the second insulating layer 111b, such that it is in contact with the connection member 140. The first wiring layer 112a and the second wiring layer 112b of the core member 110 may be disposed at respective levels that are both between an active surface and an inactive surface of the semiconductor chip 120. The core member 110 may be formed at a thickness corresponding to that of the semiconductor chip 120. Therefore, the first wiring layer 112a and the second wiring layer 112b formed in the core member 110 may be disposed on the level between the active surface and the inactive surface of the semiconductor chip 120.

Thicknesses of the wiring layers 112a, 112b, 112c, and 112d of the core member 110 may be greater than those of the redistribution layers 142 of the connection member 140.

Since the core member 110 may have a thickness equal to or greater than that of the semiconductor chip 120, the wiring layers 112a, 112b, 112c, and 112d may have large sizes. On the other hand, the redistribution layers 142 of the connection member 140 may have relatively small sizes for thinness.

In the preceding discussions of various embodiments, overlapping descriptions were omitted only for convenience and readability.

As set forth above, according to the exemplary embodiments in the present disclosure, a fan-out semiconductor package includes a core member disposed in a region in which a semiconductor chip is encapsulated. The core member may support the fan-out semiconductor package and contain wirings. The fan-out semiconductor package may substantially prevent a problem of voids in the encapsulant in spite of including the core member.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a core member having a through-hole;
a semiconductor chip disposed in the through-hole and having an active surface with connection pads and an inactive surface opposing the active surface;
an encapsulant encapsulating at least portions of the core member and the semiconductor chip and filling at least a portion of the through-hole; and
a connection member on the core member and the active surface of the semiconductor chip and including a redistribution layer electrically connected to the connection pads of the semiconductor chip,
wherein the core member includes a groove portion penetrating from a wall of the through-hole up to an outer side surface of the core member in a lower portion of the core member on which the connection member is disposed.

2. The fan-out semiconductor package of claim 1, wherein the encapsulant fills at least a portion of the groove portion.

3. The fan-out semiconductor package of claim 1, wherein the groove portion includes first to fourth groove portions in four corners of the lower portion of the core member, respectively.

4. The fan-out semiconductor package of claim 3,
wherein the core member includes a fifth groove portion penetrating through the lower portion of the core member along an edge of the core member in an outer side portion of the lower portion of the core member, and
wherein the first to fourth groove portions are connected to the fifth groove portion.

5. The fan-out semiconductor package of claim 1,
wherein the through-hole of the core member has a tapered shape.

6. The fan-out semiconductor package of claim 1,
wherein the semiconductor chip includes a passivation layer on the active surface and covering at least portions of the connection pads, and
wherein the encapsulant fills at least a portion of a space between the passivation layer and the connection member.

7. The fan-out semiconductor package of claim 1,
wherein the core member includes a first insulating layer in contact with the connection member, a first wiring layer in contact with the connection member and embedded in the first insulating layer, and a second wiring layer disposed on a second surface of the first insulating layer opposing a first surface of the first insulating layer in which the first wiring layer is embedded, and
wherein the first and second wiring layers are electrically connected to the connection pads.

8. The fan-out semiconductor package of claim 7,
wherein the core member further includes a second insulating layer on the first insulating layer and covering the second wiring layer and a third wiring layer on the second insulating layer, and
wherein the third wiring layer is electrically connected to the connection pads.

9. The fan-out semiconductor package of claim 8, wherein the groove portion is formed in a lower portion of the first insulating layer.

10. The fan-out semiconductor package of claim 8, wherein a lower surface of the first insulating layer has a step with respect to a lower surface of the first wiring layer.

11. The fan-out semiconductor package of claim 1,
wherein the core member includes a first insulating layer and first and second wirings on opposing surfaces of the first insulating layer, respectively, and
wherein the first and second wiring layers are electrically connected to the connection pads.

12. The fan-out semiconductor package of claim 11,
wherein the core member further includes a second insulating layer on the first insulating layer and covering the first wiring layer, a third wiring layer on the second insulating layer, a third insulating layer on the first insulating layer and covering the second wiring layer, and a fourth wiring layer on the third insulating layer, and
wherein the third and fourth wiring layers are electrically connected to the connection pads.

13. The fan-out semiconductor package of claim 12, wherein the groove portion is formed in a lower portion of the second insulating layer.

14. The fan-out semiconductor package of claim 12, wherein the first insulating layer has a thickness greater than those of the second and third insulating layers.

15. A fan-out semiconductor package comprising:
a connection member;
an electronic component on the connection member; and
a core member on the connection member, including a through-hole, with the electronic component located within the through-hole, and including one or more grooves along a lower surface of the core member, the one or more grooves facing the connection member and extending from the through-hole to an outer surface of the core member in the peripheral direction.

16. The fan-out semiconductor package of claim 15, wherein the core member further comprises peripheral grooves facing the connection member and extending along an outer periphery of the core member.

17. The fan-out semiconductor package of claim 15, wherein the through-hole of the core member has a lower area, in plan view, on a lower side of the core member facing the connection member that is smaller than an upper area, in plan view, at an upper side of the core member opposing the lower side.

18. The fan-out semiconductor package of claim 15, wherein:
the electronic component includes an active surface facing the connection member and including a plurality of connection pads, and the connection member includes a redistribution layer electrically connected to the plurality of connection pads of the electronic component.

19. A fan-out semiconductor package comprising:
a connection member, including an upper and lower surface, a redistribution layer, and electrical connection structures protruding from the lower surface and electrically connected to the redistribution layer;
a semiconductor chip above the upper surface of the connection member, including connection pads on a lower surface of the semiconductor chip, facing the connection member, the connection pads electrically connected to the redistribution layer of the connection member;
a core member above the upper surface of the connection member, including a through-hole containing the semiconductor chip, wiring layers electrically connected to the redistribution layer of the connection member, and first through fourth grooves facing the connection member and extending from respective inner corners of the through-hole to respective outer corners of the core member in the peripheral direction;
an encapsulant, above the semiconductor chip and the core member, in the through hole between the semiconductor chip and the core member, and in at least a portion of the first through fourth grooves.

20. The fan-out semiconductor package of claim 19, wherein:
the core member further includes an outer groove facing the connection member, extending along an outer circumference of the core member, and connected to the first through fourth grooves, and
the encapsulant substantially fills the first through fourth grooves and is in at least a portion of the outer groove.

21. The fan-out semiconductor package of claim 20, wherein the through-hole has a tapered shape with the area of the through-hole decreases toward the connection member.

22. The fan-out semiconductor package of claim 19, wherein the core member includes a plurality of insulating layers, and one of the plurality of insulating layers is thicker than any other of the plurality of insulating layers and contains a material different from that of any other of the plurality of insulating layers.

* * * * *